United States Patent
Bae et al.

(10) Patent No.: US 7,962,832 B2
(45) Date of Patent: Jun. 14, 2011

(54) METHOD FOR DETECTING MEMORY ERROR

(75) Inventors: Hyun Seop Bae, Seoul (KR); Gwang Sik Yoon, Seoul (KR); Seung Uk Oh, Gyeonggi (KR)

(73) Assignee: Suresoft Technologies, Inc. (KR)

( * ) Notice: Subject to any disclaimer, the term of this patent is extended or adjusted under 35 U.S.C. 154(b) by 347 days.

(21) Appl. No.: 12/036,550

(22) Filed: Feb. 25, 2008

(65) Prior Publication Data

US 2008/0270855 A1    Oct. 30, 2008

(30) Foreign Application Priority Data

Apr. 30, 2007   (KR) ................ 10-2007-0041945

(51) Int. Cl.
*G11C 29/00*   (2006.01)
(52) U.S. Cl. ...................................... 714/763
(58) Field of Classification Search .......... 714/763, 714/765
See application file for complete search history.

(56) References Cited

U.S. PATENT DOCUMENTS

| | | | | |
|---|---|---|---|---|
| 4,710,934 A | * | 12/1987 | Traynor ........................ 714/765 |
| 5,077,720 A | * | 12/1991 | Takagi et al. ................ 369/59.25 |
| 5,557,622 A | * | 9/1996 | Hassoun et al. .............. 714/800 |
| 5,590,329 A | * | 12/1996 | Goodnow et al. ............ 717/144 |
| 5,628,016 A | * | 5/1997 | Kukol ........................... 717/140 |
| 5,644,709 A | * | 7/1997 | Austin ............................ 714/53 |
| 5,819,252 A | * | 10/1998 | Benson et al. ...................... 1/1 |
| 6,035,432 A | * | 3/2000 | Jeddeloh ....................... 714/763 |
| 6,237,110 B1 | * | 5/2001 | Lin et al. .......................... 714/7 |
| 6,243,845 B1 | * | 6/2001 | Tsukamizu et al. ........... 714/769 |
| 6,671,771 B2 | * | 12/2003 | Perloff .......................... 711/108 |
| 7,051,264 B2 | * | 5/2006 | Leung et al. .................. 714/763 |
| 7,246,302 B2 | * | 7/2007 | Kim ............................... 714/769 |
| 7,370,260 B2 | * | 5/2008 | Nahas ........................... 714/763 |
| 7,631,244 B2 | * | 12/2009 | Suzuki et al. ................. 714/763 |

* cited by examiner

*Primary Examiner* — James C Kerveros
(74) *Attorney, Agent, or Firm* — The Belles Group, P.C.

(57) ABSTRACT

A method for easily detecting a memory error that may occur when a memory is accessed or an allocated memory is freed in the process of developing software is disclosed. The memory error detecting method includes: (a) generating an original block indication variable for indicating a starting memory block of a memory region allocated with respect to a variable included in a computer program; (b) detecting a memory error that may occur when the allocated memory region is accessed, by performing a certain operation (computing or arithmetic operation), before the allocated memory region is accessed, using a target block indication variable indicating memory block to be accessed in the allocated memory region and/or the original block indication variable; and (c) outputting information about a detected memory error.

8 Claims, 3 Drawing Sheets

US 7,962,832 B2

METHOD FOR DETECTING MEMORY ERROR

This Nonprovisional application claims priority under 35 U.S.C. §119(a) on Patent Application No. 2007-41945 filed in Korea on Apr. 30, 2007, the entire contents of which are hereby incorporated by reference.

BACKGROUND OF THE INVENTION

1. Field of the Invention

The present invention relates to a method for detecting a memory error and, more particularly, to a method for easily detecting a memory error that may occur when a memory is accessed or an allocated memory is freed in the process of developing software.

2. Description of the Related Art

One of the errors that frequently occur in the process of software programming is an error in using a memory. In order for software to operate, generally, numerous variables are allocated for use in the memory. When the memory is inappropriately accessed or freed in a program, a fatal error may occur in runtime. Thus, a program developer should be careful that an inappropriate memory use does not occur in the programming stage and should correct a program code not to cause a memory error through debugging or testing.

However, to date, in order to remove such an error in using the memory in the programming process in developing software, a programmer carefully performs coding, personally examines a program source code after coding, and executes a program in various execution environments, and when an error occurs, the programmer debugs the error as the need arises. This method, however, has many problems in that high costs are needed and much time is necessary for detecting an error in using the memory, and if no error occurs by chance in executing the program although the memory is inappropriately used, such memory error can be hardly detected, which will inevitably lead to a fatal error at the stage of using the program, possibly causing a huge amount of loss of expenses.

SUMMARY OF THE INVENTION

The present invention has been made in view of the above-mentioned problem, and it is an object of the invention to provide a method for detecting a memory error whereby the likelihood of causing a memory error whenever a memory is used is checked in a program source code.

In one aspect, a method for detecting a memory error comprises: (a) generating an original block indication variable for indicating a starting memory block of a memory region allocated with respect to a variable included in a computer program; (b) detecting a memory error that may occur when the allocated memory region is accessed, by performing a certain operation (computing or arithmetic operation) before the allocated memory region is accessed, using a target block indication variable indicating memory block to be accessed in the allocated memory region and/or the original block indication variable; and (c) outputting information about a detected memory error.

Here, step (b) may comprise: (b1) checking whether or not the value of the target block indication variable is identical to a null value; and (b2) determining a memory error when the value of the target block indication variable is identical to the null value.

Step (b) may comprise: (b1) checking whether or not the value of the original block indication variable has been initialized; and (b2) determining a memory error if the original block indication variable has not been initialized.

Step (b) may comprise: (b1) checking whether or not the value of the original block indication variable is the null value; and (b2) determining a memory error if the value of the original block indication variable is the null value.

Step (b) may comprise: (b1) checking whether or not the target block indication variable indicates a memory block outside the bounds of the allocated memory region; and (b2) determining a memory error if the target block indication variable indicates a memory block outside the bounds of the allocated memory region.

The method may further comprise: (d) allocating an identification code to each memory block of the allocated memory region before step (b), and it may be checked whether or not the target block indication variable indicates a memory block outside the bounds of the allocated memory region by using the identification codes in step (b1).

The identification codes that correspond to the respective memory blocks included in a single allocated memory region may be successively stored in an identification code map region of a computer memory to form a single identification code group, and in step (d); the identification codes may be allocated such that identification codes of a single identification code group are the same and identification codes of adjacent identification code groups in the identification code map region are different, and step (b1) may comprise: (b1-1) checking whether or not an identification code corresponding to a memory block indicated by the target block indication variable is identical to an identification code corresponding to a memory block indicated by the original block indication variable; and (b1-2) determining that the target block indication variable indicates a memory block out of the bounds of the allocated memory region, if the identification codes are not the same.

The identification codes of the identification code group may be one of first to third bit values, and a fourth bit value may be stored at a portion where the identification code groups are not formed in the identification code map region.

The computer program that performs such methods may be stored in a computer-readable recording medium.

In another aspect, a method for detecting a memory error comprises: (a) generating an original block indication variable for indicating a starting memory block in a memory region allocated with respect to variables included in a computer program; (b) detecting a memory error that may occur when the allocated memory region is freed by performing a certain operation, before the allocated memory region is freed, using a target block indication variable indicating a memory block to be accessed in the allocated memory region and/or the original block indication variable; and (c) outputting information about a detected memory error.

Here, step (b) may comprise: (b1) checking whether or not the value of the target block indication variable is identical to a null value; and (b2) determining a memory error when the value of the target block indication variable is identical to the null value.

Step (b) may comprise: (b1) checking whether or not the value of the original block indication variable has been initialized; and (b2) determining a memory error if the original block indication variable has not been initialized.

Step (b) may comprise: (b1) checking whether or not the target block indication variable indicates a memory block which is at the outside of a heap memory to which the allocated memory region belongs; and (b) determining a memory error when the target block indication variable indicates a memory block which is at the outside of the heap memory to which the allocated memory region belongs.

Step (b) may comprise: (b1) checking whether or not the value of the original block indication variable is the null value; and (b2) determining a memory error when the value of the original block indication variable is the null value.

Step (b) may comprise: (b1) checking whether or not the target block indication variable indicates the starting memory block in the allocated memory region; and (b2) determining a memory error if the target block indication variable does not indicate the starting memory block in the allocated memory region.

The method may further comprise: (d) allocating an identification code to each memory block of the allocated memory region before step (b), and it may be checked whether or not the starting memory block in the allocated memory region is indicated by using the identification codes in step (b1).

The identification codes corresponding to the respective memory blocks included in a single allocated memory region may be successively stored in an identification code map region of a computer memory to form a single identification code group, and in step (d), the identification codes may be allocated such that identification codes of a single identification code group are the same and identification codes of adjacent identification code groups in the identification code map region are different, and step (b1) may comprise: (b1-1) checking whether or not an identification code corresponding to a memory block indicated by the target block indication variable is identical to an identification code that immediately precedes in the identification code map region; and (b1-2) determining that the target block indication variable does not indicate the starting memory block in the allocated memory region, if the identification codes are not identical.

The identification codes of the identification code group may be one of first to third bit values, and a fourth bit value may be stored at a portion where the identification code groups are not formed in the identification code map region.

The computer program that performs such methods may be stored in a computer-readable recording medium.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

Hereinafter, a method for detecting a memory error according to the present invention will now be described with reference to the accompanying drawings.

To begin with, types of memory errors to which the present invention may be applicable will now be described. Memory errors that may occur in accessing a memory may comprise a null pointer access error, an invalid pointer access error, an out-of-bound access error, and the like.

The null pointer access error may occur when although a value of a pointer variable for accessing a memory is null, a command for accessing the memory is executed by using the pointer variable. The invalid pointer access error may comprise a memory error that occurs when a memory that has not been allocated is accessed and a memory error that occurs when a memory desired to be accessed has been freed from an allocated state. The out-of-bound access error may refer to a memory error that occurs when a memory outside the bounds of a memory region allocated to a corresponding variable is accessed while accessing a memory to perform a certain calculation with a particular variable.

Memory errors that may occur in freeing a memory may be classified into largely two kinds of error: an illegal free error and a duplicate free error.

The illegal free error may comprise a memory error that occurs when a value of a pointer variable indicating a memory desired to be freed is a null value, a memory error that occurs when a memory that has not been allocated is freed, a memory error that occurs when a memory to be freed is outside the bounds of a heap memory region, a memory error that occurs when a pointer variable indicating a memory desired to be freed does not indicate a starting memory block of the memory desired to be freed, and the like.

The duplicate free error occurs when an already freed memory is freed again.

The method for detecting such memory errors according to the embodiment of the present invention will now be described with reference to the accompanying drawings.

Figure 1:
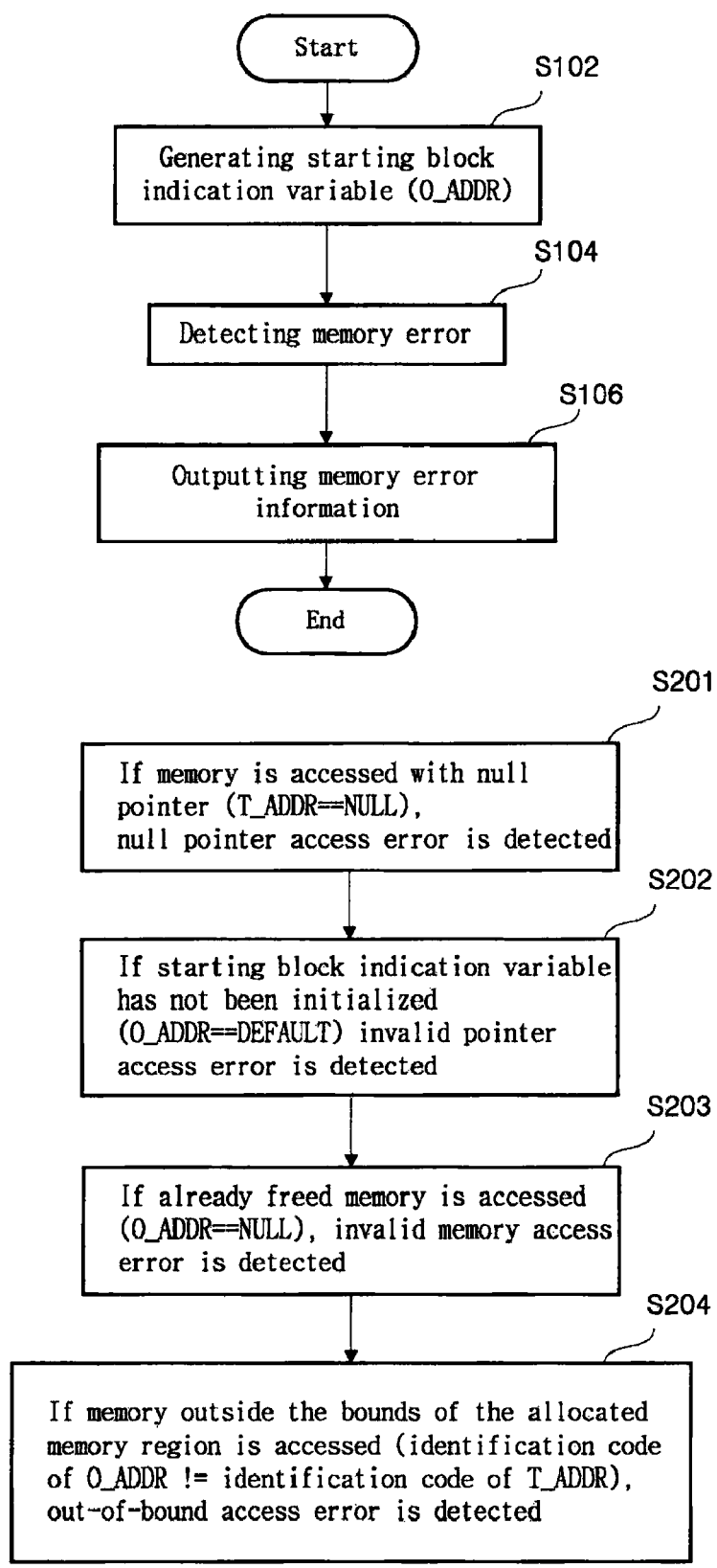
FIG. 1 is a flow chart illustrating the process of a method for detecting a memory error in accessing a memory according to an embodiment of the present invention.

With reference to FIG. 1, first, when a memory is allocated with respect to a variable included in a program, an original block indication variable is generated to indicate a starting memory block of the allocated memory region (S102). Namely, whenever a memory allocation is generated, the original block indication variable is defined and initialized at a program source code. This process may be manually performed by a developer during a program coding, or may be automatically performed after the program coding is completed.

Next, whenever the allocated memory region is accessed with respect to the corresponding variable, a certain operation is performed using a target block indication variable indicating an access target memory block (i.e., a memory block to be accessed) in the allocated memory region and/or the original block indication variable in order to detect a memory error that may occur in accessing the allocated memory region (S104). Namely, a source code that would call the API function to perform the operation is added to every portion of the source code where the memory access is expected to be made, so that the API function would be able to be called before the memory access. The addition of the source code may be manually performed by the developer during the program coding operation, or may be automatically performed after the program coding operation is completed.

If a memory error is expected to occur according to the detection result, information regarding the detected memory error is outputted (S106).

As mentioned above, the program source code should be modified so that the program source code includes the original block indication variables and the code that would call a certain API function, and the modified program is executed to output memory error-associated information, and the program should be corrected based on the memory error-associated information. After the program development is completed, preferably, contents which have been added to the program source code is deleted, and such deletion may be manually performed by the developer or may be automatically performed.

For instance, when malloc( ) is called in the program, a memory as large as desired by the user is allocated and a memory address is returned. In this case, when the memory is allocated by calling malloc( ), the variable for having the returned memory address of the allocated memory region is the target block indication variable and the variable for indicating the starting memory block of the allocated memory region is the original block indication variable. Besides the function malloc( ), the present invention may be applicable to an arbitrary function that may allocate or access the memory. Also, the present invention is applicable not only for a particular programming language but also for an arbitrary case where, in a system comprising a memory or a storage unit equivalent to the memory, such storage unit is accessed or freed. The method for detecting a memory error according to the types of memory errors will now be described in detail.

In accessing the allocated memory region, in order to detect a null pointer access error, it is checked whether the value of the target block indication variable is equal to a null value. If the value of the target block indication variable is equal to the null value, a memory error is determined (namely, it is determined that there is a memory error) (S201).

In accessing the allocated memory region, in order to detect a memory error that may occur when a memory which has not been allocated is accessed, it is checked whether the value of the original block indication variable has been initialized. If the value of the original block indication variable has not been initialized, an invalid pointer access error is determined (S202).

In order to detect a memory error that may occur when a memory desired to be accessed is a memory which has been already freed (from an allocated state), it is checked whether or not the value of the original block indication variable is the null value. If the value of the original block indication variable is the null value, the invalid memory access error is determined (S203).

In addition, an out-of-bound access error is detected (S204). The method for detecting an out-of-bound access error will now be described in detail with reference to FIG. 2.

First, as afore-mentioned, the out-of-bound access error refers to a memory error that occurs when a memory outside the bounds of a memory region allocated to a corresponding variable is accessed while accessing a memory 110 to perform an operation with a particular variable. Thus, in order to detect the out-of-bound access error, it is checked whether or not the target block indication variable indicates a memory block outside the bounds of the allocated memory region. To detect the out-of-bound access error, the error detection method according to the present invention employs a bit map coloring which will be explained hereinafter.

For example, when the memory regions 112, 114 and 116 are allocated with respect to respective variables 'a', 'b' and 'c' included in the computer program, identification codes are allocated to each memory block of the allocated memory regions 112, 114 and 116. For example, identification codes are allocated to the memory blocks 116a and 116b of the allocated memory region 116. In this case, the same identification code is allocated to the memory blocks belonging to the same allocated memory region.

The identification codes corresponding to the respective memory blocks (e.g., 116a and 116b) included in each of the allocated memory regions 112, 114, and 116 are continuously stored in an identification code map region 120 of the computer memory to form identification code group 122, 124, and 126, respectively. For example, if variables 'a', 'b', and 'c' are sequentially allocated a memory in the program, five of identification codes '11' corresponding to the five memory blocks in the allocated memory region 112 with respect to the variable 'a' are continuously stored in the identification code map region 120 to form an identification code group 122. Also, four of identification codes '10' corresponding to four memory blocks in the allocated memory region 114 with respect to the variable 'b' are continuously stored in the identification code map (bit map) region 120 to form an identification code group 124. Before the identification code groups are formed, the identification code map region 120 have been initialized to a value '00'.

The order of the identification codes '11', '10', and '01' may be arbitrarily allocated, and the identification codes are allocated such that the identification codes belonging to same identification code group are the same while the identification codes of adjacent identification code groups are different. In order to allocate different identification codes to adjacent identification code groups, three identification codes are required. Also, an identification code for indicating an initialized state of the identification code map region 120 is required. In the embodiment of the present invention, the 2-bit value is used to express four identification codes, which are merely an example. That is, the bit value may have an arbitrary bit number, and in addition, as the identification codes, four different identification codes may be sufficiently used. A color value may be allocated to each identification code to display a memory allocation and a usage state to the user (bit map coloring). In addition, the identifications may not be necessarily stored physically continuously in the identification code map region 120, so the identification code map region 120 may have an arbitrary logically continued data storage structure.

In order to detect the out-of-bound access error by using the bit map coloring, a method of checking whether or not the identification code corresponding to the memory block indicated by the target block indication variable and the identification code corresponding to the memory block indicated by the original block indication variable are identical may be used. If the identification codes are not identical, because it means that the target block indication variable with respect to the corresponding variable indicates a memory block outside the bounds of the allocated memory region, the out-of-bound access error can be detected.

One or more of the error detecting methods according to the types of memory errors may be performed regardless of the order to detect memory errors.

Figure 3:
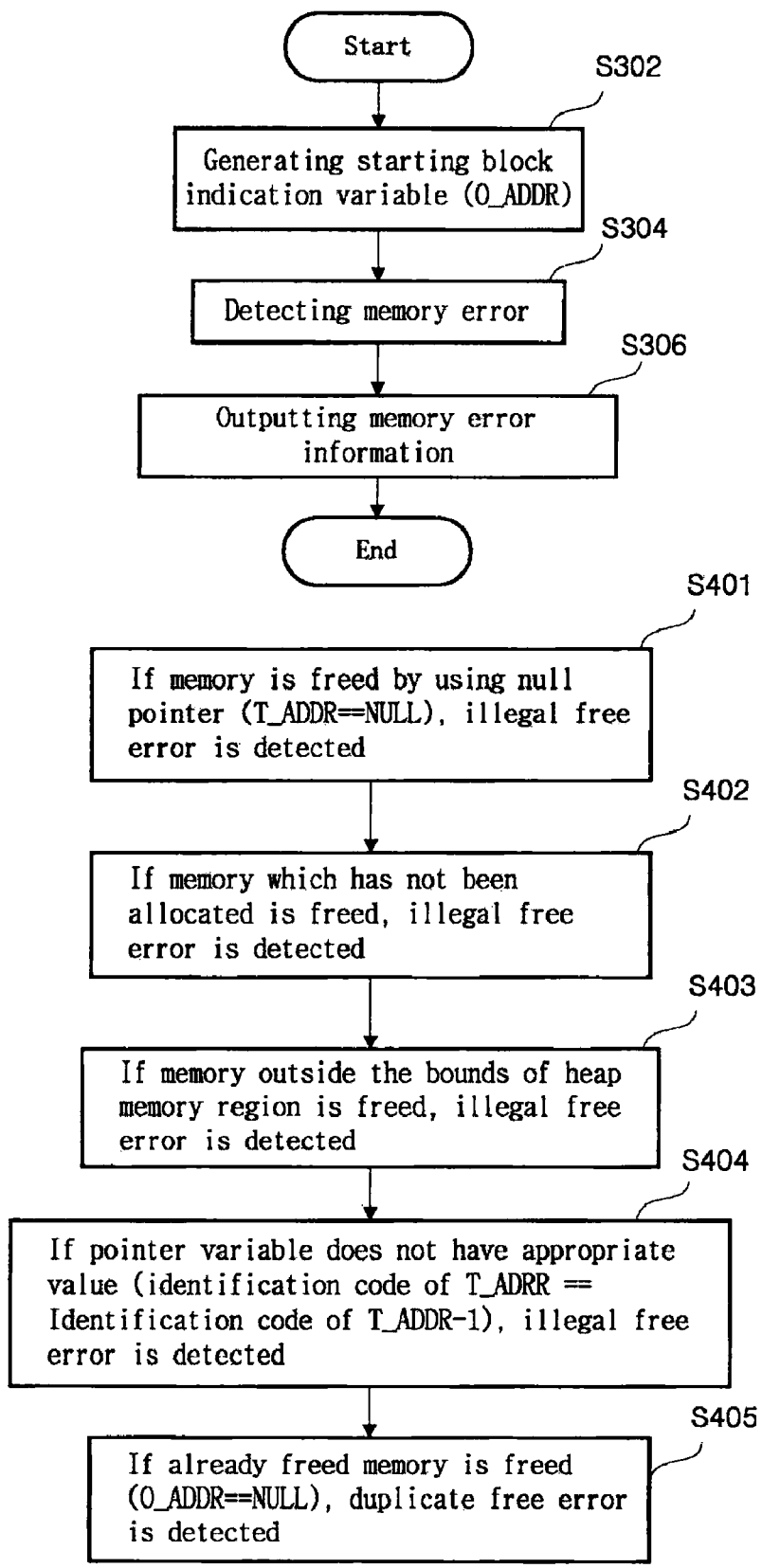
FIG. 3 is a flow chart illustrating the process of a method for detecting a memory error in freeing a memory according to the embodiment of the present invention.

The method for detecting a memory error that may occur when the memory is freed will now be described with reference to FIG. 3. This method comprises generating an original block indication variable for indicating a starting memory block of a memory region allocated with respect to a variable included in the computer program (S302); detecting a memory error that may occur when an allocated memory region is freed, by performing a certain operation, before the allocated memory region is freed, using a target block indication variable that indicates a memory block to be accessed in the allocated memory region (S304); and outputting information regarding a detected memory error.

First, in order to detect a case where a memory is freed by using a pointer variable having a null value, it is checked whether the value of the target block indication variable is identical to the null value. If the value of the target block indication variable is identical to the null value, the illegal free error is determined (S401).

Next, in order to detect a case where a memory which has not been allocated is freed, it is checked whether the value of the original block indication variable has been initialized. If the value of the original block indication variable has not been initialized, the illegal free error is determined (S402). In order to make this method effective, it is necessary to generate the original block indication variable each time a memory is allocated, and initialize the value of the original block indication variable. Thus, if the original block indication variable has not been initialized, it may be determined that a memory has not been allocated.

And then, if a memory desired to be freed from an allocated state is at the outside of a heap memory, a fatal memory error would be caused. Thus, it is checked whether or not the target block indication variable indicates a memory block at the outside of the heap memory to which the allocated memory region belongs, and if the target block indication variable indicates a memory at the outside of the heap memory, it is determined as the illegal free error (S403).

Figure 2:
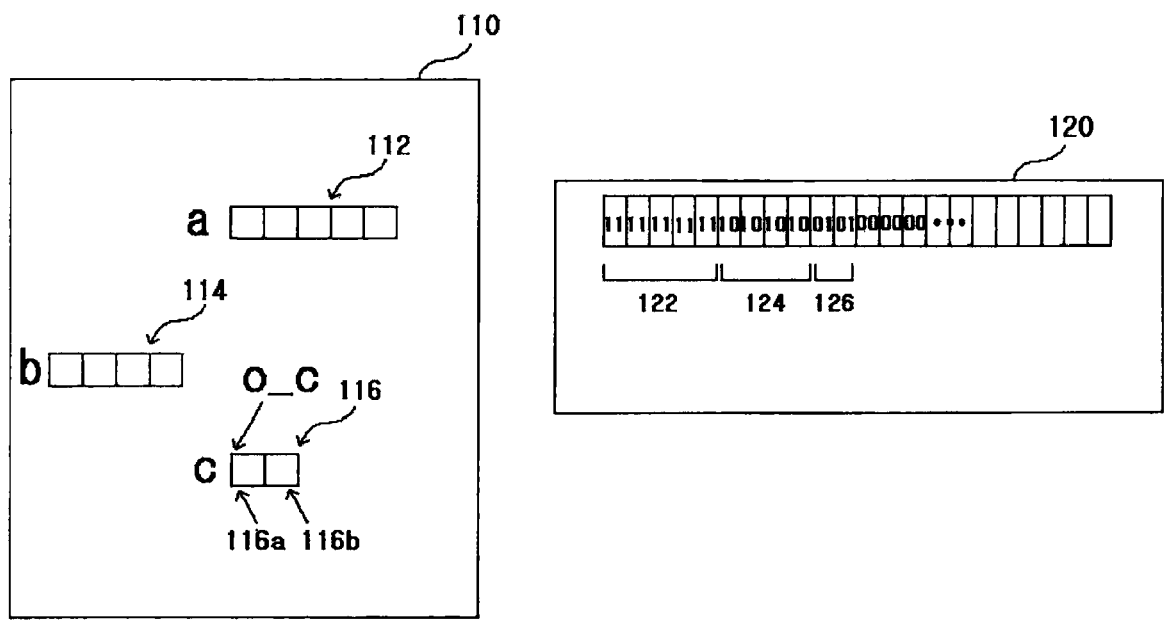
FIG. 2 is a schematic view illustrating memory regions to explain the method for detecting a memory error according to the embodiment of the present invention.

A memory error may be determined by checking whether or not a pointer variable indicating a memory to be freed has an appropriate value. For example, if a memory is freed by calling the function free( ), an pointer variable of the function free( ) should indicate a starting block of the allocated memory region to be freed. Thus, in order to detect the relevant memory error, the above-mentioned bit map coloring method is employed. With reference to FIG. 2, in order to free the allocated memory region 114 related to the variable 'b', it is checked whether the identification code (the identification code of T_ADDR: the initial identification code '10' of the identification code group 124) is identical to the preceding one (identification code of T_ADDR-1). If the two identification codes are identical, it means that the target block indication variable does not indicate the starting memory block of the allocated memory region, so the illegal free error can be detected (S404).

Next, in order to detect the case where an allocated memory region is repeatedly freed, it is checked whether the value of the original block indication variable is the null value. If the value of the original block indication variable is the null value, the duplicate free error is detected. In order to make this method effective, when the allocated memory region is lawfully released, the null value needs to be allocated to the original block indication variable (S405). One or more of the error detecting methods according to the types of memory errors may be performed regardless of the order to detect the memory errors.

The types of memory errors detected by the memory error detecting method according to the present invention as described above are merely examples, and various other memory errors may be detected by using the technical concept of the present invention in which, in allocating a memory, the original block indication variable is generated to detect memory errors that may occur through operation with respect to the variable or memory errors are detected by using the bit map coloring method.

As described above, memory errors, which may occur when a memory is accessed or freed such as in the programming process of a computer program or in the execution process of the computer program, etc, can be automatically and reliably detected.

The preceding specific embodiments are illustrative of the practice of the invention. It is to be understood, however, that other expedients known to those skilled in the art or disclosed herein, may be employed without departing from the spirit of the invention or the scope of the appended claims.

What is claimed is:

1. A method for detecting a memory error within source code of a computer program stored in a memory, comprising:
   (a) generating an original block indication variable for indicating a starting memory block of an allocated memory region, the allocated memory region having bounds;
   (b) adding an error check source code to the source code of the computer program that performs a computing operation, wherein the error check source code is added before portions of the source code of the computer program where memory access will occur, and wherein the computing operation checks for memory errors;
   (c) generating an identification code map region using the original block indication variable, the identification code map region stored in the memory;
   (d) detecting if an out of bounds memory error will occur when the allocated memory region is accessed before the allocated memory region is accessed by executing the error check source code to perform the computing operation,
      wherein the computing operation uses the identification code map region and at least one of a target block indication variable and the original block indication variable, wherein the target block indication variable indicates a memory block to be accessed in the allocated memory region, and
      wherein the computing operation checks whether the target block indication variable indicates a memory block outside the bounds of the allocated memory region, and determines a memory error if the target block indication variable indicates a memory block outside the bounds of the allocated memory region; and
   (e) outputting information about a detected memory error.

2. A computer-readable recording medium that stores a program which, when executed by a computer, causes the computer to execute the method as described in claim 1.

3. The method of claim 1, wherein the error check source code calls an API function to perform the computer operation.

4. The method of claim 1, further comprising:
   (f) correcting the computer program source code if the memory error is detected.

5. The method of claim 1, further comprising:
   (f) removing the error check source code from the computer program source code.

6. The method of claim 1, wherein generating the identification code map region in step (b) further comprises:
   allocating an identification code to each memory block of the allocated memory region, wherein the identification code that corresponds to the respective memory blocks included in a single allocated memory region are successively stored in the identification code map region to form a single identification code group, and wherein the identification codes are allocated such that identification codes of the single identification code group are the same and identification codes of adjacent identification code groups in the identification code map region are different.

7. The method of claim 6 wherein the computing operation bf step (c) further comprises:

checking whether or not an identification code corresponding to a memory block indicated by the target block indication variable is identical to an identification code corresponding to a memory block indicated by the original block indication variable, and determining that the target block indication variable indicates a memory block out of the bounds of the allocated memory region if the identification codes are not the same.

8. The method of claim 6, wherein the identification codes of the identification code group are one of first to third bit values, and a fourth bit value is stored at a portion where the identification code groups are not formed in the identification code map region.

* * * * *